(12) United States Patent
Wakai et al.

(10) Patent No.: US 6,975,066 B2
(45) Date of Patent: Dec. 13, 2005

(54) ORGANIC EL ELEMENT

(75) Inventors: Hitoshi Wakai, Niigata (JP); Jun-Ichi Maruyama, Niigata (JP); Hiroshi Ohkawa, Niigata (JP)

(73) Assignee: Nippon Seiki Co., Ltd., Niigata (JP)

(*) Notice: Subject to any disclaimer, the term of this patent is extended or adjusted under 35 U.S.C. 154(b) by 0 days.

(21) Appl. No.: 10/129,927

(22) PCT Filed: Jun. 22, 2001

(86) PCT No.: PCT/JP01/05382

§ 371 (c)(1),
(2), (4) Date: May 13, 2002

(87) PCT Pub. No.: WO02/23955

PCT Pub. Date: Mar. 21, 2002

(65) Prior Publication Data

US 2002/0163298 A1 Nov. 7, 2002

(30) Foreign Application Priority Data

Sep. 14, 2000 (JP) ............................ 2000-285215

(51) Int. Cl.[7] ............................................. B05D 5/12
(52) U.S. Cl. ....................................... 313/510; 313/513
(58) Field of Search ............................... 313/502, 503, 313/504, 505, 517, 506, 509, 510, 513; 315/169.1, 315/169.2, 169.3

(56) References Cited

U.S. PATENT DOCUMENTS

| | | | |
|---|---|---|---|
| 3,911,431 A * | 10/1975 | Katsumura et al. ..... | 340/815.45 |
| 4,488,783 A | 12/1984 | Minami | |
| 4,571,523 A * | 2/1986 | Morimoto et al. ......... | 313/497 |
| 5,644,327 A * | 7/1997 | Onyskevych et al. ......... | 345/80 |
| 5,898,276 A | 4/1999 | Tsuruoka et al. | |
| 5,902,688 A * | 5/1999 | Antoniadis et al. ......... | 428/690 |
| 5,949,186 A * | 9/1999 | Nagayama et al. ......... | 313/504 |
| 5,998,926 A * | 12/1999 | Tsuruoka et al. ........... | 313/506 |
| 6,030,700 A * | 2/2000 | Forrest et al. .............. | 428/336 |
| 6,114,805 A * | 9/2000 | Codama et al. ............. | 313/509 |
| 6,280,909 B1 * | 8/2001 | Gill et al. .................... | 430/317 |
| 6,320,311 B2 * | 11/2001 | Nakaya et al. .............. | 313/506 |
| 6,414,432 B1 * | 7/2002 | Hieda et al. ................ | 313/506 |
| 6,541,910 B2 * | 4/2003 | Uchida et al. .............. | 313/504 |
| 6,556,515 B1 * | 4/2003 | Sekiguchi ................... | 368/242 |
| 6,624,571 B1 * | 9/2003 | Toyoyasu et al. ........... | 313/510 |
| 6,768,258 B2 * | 7/2004 | Kobayashi .................. | 313/504 |

FOREIGN PATENT DOCUMENTS

| | | |
|---|---|---|
| JP | 53-26696 | 3/1978 |
| JP | 61-288396 | 12/1986 |
| JP | 5-29080 | 2/1993 |
| JP | 5-234681 | 9/1993 |
| JP | 9-106887 | 4/1997 |
| JP | 11-135264 | 5/1999 |

* cited by examiner

*Primary Examiner*—Joseph Williams
*Assistant Examiner*—Dalei Dong
(74) *Attorney, Agent, or Firm*—McDermott Will & Emery LLP

(57) ABSTRACT

An object is to provide an organic EL element which can realize the improvement in the difference of an emission luminance due to the difference of an emission rise time in a plurality of light emitting portions. Segment portions S for determining an emission in a specific shape and wiring portions L for separately supplying electric currents to the segment portions S are formed. An area of the wiring portion L of the segment portion S is enlarged such that an emission luminance in the segment portion S falls within a range of from a minimum luminance to a luminance 30% higher than that.

4 Claims, 2 Drawing Sheets

ORGANIC EL ELEMENT

TECHNICAL FIELD

The present invention relates to an organic EL (electroluminescence) element, and particularly to an organic EL element which can realize an improvement in the difference of an emission luminance due to the difference of emission rise time in a plurality of light emitting portions.

BACKGROUND ART

As shown in FIG. 3, Japanese patent Laid-Open No. 234681/1993 or the like discloses an organic EL element in which a transparent electrode 2, an organic layer 3, a back electrode 4 are successively formed on a translucent insulating substrate 1, and the organic layer 3 is constituted by, for example, a hole injecting layer, a hole transporting layer, a light emitting layer, and an electron transporting layer.

In the organic EL element as stated above, a direct current power supply of several tens of volts is connected to the transparent electrode 2 and the back electrode 4 to supply an electric current between the electrodes 2 and 4, so that the organic layer 3 emits light, and the light is irradiated toward the outside through the substrate 1. Its light emitting portion is generally determined by the pattern of the transparent electrode 2, except for a dot matrix type.

That is, as shown in FIG. 4, a display portion D and a wiring pattern L for supplying an electric current to this are patterned and are formed on the substrate 1 of glass or the like by using a translucent conductive material such as ITO and by a method such as vapor deposition. The display portion D is formed to be a size larger than the segment portion (region indicated by a dotted line in FIG. 4) S corresponding to the emission in a specific shape, and as shown in FIG. 3, an insulating layer 5 formed by a suitable measure, such as spin coating or roll coating, using an insulating material such as polyimide, acrylic, or phenol, is positioned between the transparent electrode 2 and the organic layer 3. The part of the display portion D other than the segment portion S (the part covered with the insulating layer 5) is a part of the wiring portion L, and forms the insulating layer 5 except for the emission in a specific shape. That is, by removing the insulating layer 5 on the segment portion S, the shape of the segment portion S has been made the desired emission in a specific shape.

In the organic EL element as stated above, for example, as shown in FIG. 4, in a case where seven segment portions S1 to S7 are arranged in the shape of a the numeral 8 to express the figures 0 to 9, display portions D1 to D7 including the segment portions S1 to S7 and wiring portions L1 to L7 respectively connected to them are formed, and current supply sources (not shown) are separately connected to the wiring portions L1 to L7.

Incidentally, in a case where a pattern is adopted such that the segment portions S1 to S6 are arranged clockwise, the segment portion S7 is arranged at the center, and all the wiring portions L1 to L7 connected to these are led out downward, the wiring portions L1, L2, and L6 (former group) of the segment portions S1, S2 and S6 positioned above have the extension distances longer than the wiring portions L3 to L5 and L7 (latter group) of the segment portions S3 to S5 and S7 positioned below, and the capacitance becomes larger.

By this, there is a case where the ratio of the capacitance of the segment portions S1 to S7 to the capacitance of the wiring portions L1 to L7 is much different between the former and the latter, and since it is known that an emission rise time depends on the capacitance greatly (for example, see column 0026 of Japanese Patent Laid-Open No. 29080/1993), and there are cases where differences in the emission rise time occur among the segment portions S1 to S7.

The difference of the emission rise time converts into difference of emission luminance in the segment portions S1 to S7, and the display quality is lowered. Especially in the case of such a structure that an electric current is supplied by pulse driving to control emission/non-emission of the segment portions S1 to S7, when the frequency of the pulse or the duty ratio is changed to adjust the emission luminance to a desired value, in the case where the frequency is high or the pulse width is short, there is a case where the segment portions S1, S2, and S6 connected to the former and having a long emission rise time do not emit light.

In the present invention, attention is paid to such problems, and its object is to provide an organic EL element which can realize an improvement in the difference of emission luminance due to the difference of an emission rise time in a plurality of light emitting portions.

DISCLOSURE OF THE INVENTION

As set forth in claim 1, the invention is an organic EL element comprising a transparent electrode positioned on a non-emission surface of a translucent substrate, a luminous organic layer positioned on the transparent electrode, and a back electrode positioned on the organic layer and facing the transparent electrode, the transparent electrode formed with a plurality of segment portions for determining an emission in a specific shape and a plurality of wiring portions for separately supplying electric currents to the respective segment portions, and is characterized in that the area of the wiring portion of the segment portion having a high emission luminance is enlarged such that the emission luminance of the segment portion falls within a range of from a minimum luminance in the segment portions to a luminance 30% higher than that.

Besides, as set forth in claim 2, an organic EL element comprises a transparent electrode positioned on a non-emission surface of a translucent substrate, a luminous organic layer positioned on the transparent electrode, and a back electrode positioned on the organic layer and facing the transparent electrode, the transparent electrode forming a plurality of segment portions for determining an emission in a specific shape and a plurality of wiring portions for separately supplying electric currents to the respective segment portions, and is characterized in that the segments are arranged in a shape of a numeral 8, and the wiring portion of the segment portion having a high emission luminance is extended into an inside of a display of the numeral 8 of the segment portions to enlarge an area of the wiring portion such that the emission luminance of the segment portion falls within a range of from a minimum luminance in the segment portions to a luminance 30% higher than that.

Especially, in addition to claim 1 or 2, as set forth in claim 3, a feature is that an insulating layer is positioned between the wiring portions of the transparent electrode and the organic layer.

Besides, as set forth in claim 4, an organic EL element comprises a transparent electrode positioned on a non-emission surface of a translucent substrate, a luminous organic layer positioned on the transparent electrode, a back electrode positioned on the organic layer and facing the transparent electrode, the transparent electrode forming a plurality of segment portions for determining an emission in a specific shape and a plurality of wiring portions connected to a constant current source and for separately supplying electric currents to the respective segment portions, and an insulating layer formed between the wiring portions and the organic layer except for the light emitting shape, and is characterized in that the segments are arranged in a shape of a numeral 8, and the wiring portion of the segment portion having a high emission luminance is extended to a place inside a display of the numeral 8 of the segment portions and covered with the insulating layer to enlarge an area of the wiring portion such that the emission luminance of the segment portion falls within a range of from a minimum luminance in the segment portions to a luminance 30% higher than that.

Besides, as set forth in claim 5, an organic EL element comprises a transparent electrode positioned on a non-emission surface of a translucent substrate, a luminous organic layer positioned on the transparent electrode, and a back electrode positioned on the organic layer and facing the transparent electrode, the transparent electrode forming a plurality of segment portions for determining an emission in a specific shape and a plurality of wiring portions for separately supplying electric currents to the respective segment portions, and is characterized in that a capacitance of the wiring portion of the segment portion having a high emission luminance is increased such that the emission luminance of the segment portion falls within a range of from a minimum luminance in the segment portions to a luminance 30% higher than that.

Besides, as set forth in claim 6, an organic EL element comprises a transparent electrode positioned on a non-emission surface of a translucent substrate, a luminous organic layer positioned on the transparent electrode, and a back electrode positioned on the organic layer and facing the transparent electrode, the transparent electrode forming a plurality of segment portions for determining an emission in a specific shape and a plurality of wiring portions for separately supplying electric currents to the respective segment portions, and is characterized in that an area of the wiring portion of the segment portion having a low emission luminance is decreased such that the emission luminance of the segment portion falls within a range of from a maximum luminance in the segment portions to a luminance 30% lower than that.

Especially, in clam 6, as set forth in claim 7, a feature is that an insulating layer is positioned between the wiring portions of the transparent electrode and the organic layer.

Besides, as set forth in claim 8, an organic EL element comprises a transparent electrode positioned on a non-emission surface of a translucent substrate, a luminous organic layer positioned on the transparent electrode, and a back electrode positioned on the organic layer and facing the transparent electrode, the transparent electrode forming a plurality of segment portions for determining an emission in a specific shape and a plurality of wiring portions for separately supplying electric currents to the respective segment portions, and is characterized in that a capacitance of the segment portion having a low emission luminance is decreased such that the emission luminance of the segment portion falls within a range of from a maximum luminance in the segment portions to a luminance 30% lower than that.

BEST MODE FOR CARRYING OUT THE INVENTION

The present invention will be described on the basis of an embodiment shown in the accompanying drawings, however, the same or equivalent portions as the prior art are designated by the same symbols and the detailed explanation is omitted.

Figure 1:
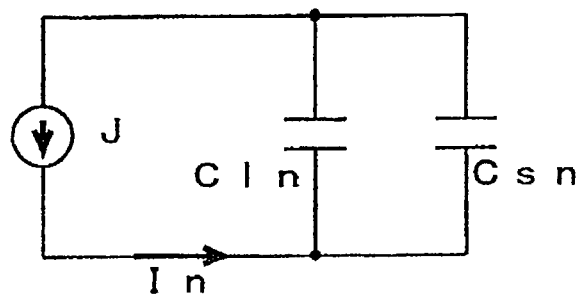
FIG. 1 is a circuit diagram for explaining an equivalent circuit of an organic EL element in an embodiment of the invention.

FIG. 1 shows an equivalent circuit of a segment portion $Sn$ ($n=1$ to 7, the same shall apply hereinafter) as one of segment portions $S1$ to $S7$ shown in FIG. 2, in which $Csn$ denotes a capacitance of an arbitrary segment portion $Sn$, $Cln$ denotes a capacitance of an arbitrary wiring portion $Ln$ (including a portion covered with an insulating layer 5 except for the segment portion $Sn$ of a display portion $Dn$, the same shall apply hereinafter), In denotes a value of an electric current supplied from a constant current source connected to the wiring portion $Ln$, and J denotes a current density obtained by dividing the current value In by an area $Ssn$ of the segment portion $Sn$. The current value In is determined so that the current density J comes to have a constant value in the respective segment portions $Sn$. Incidentally, an area of the wiring portion $Ln$ is made $Sln$.

By the use of a distance $ds$ between electrodes 2 and 4 of the segment portion $Sn$, a distance $dl$ between the electrodes 2 and 4 of the wiring portion $Ln$, a relative dielectric constant $ers$ of the segment portion $Sn$, a relative dielectric constant $erl$ of the wiring portion $Ln$, a capacitance $Cs$ ($=Csn/Ssn$) per unit area of the segment portion $Sn$, a capacitance $Cl$ ($Cln/Sln$) per unit area of the wiring portion $Ln$, a light emission voltage $Vem$ of the segment portion $Sn$, a vacuum dielectric constant $e0$, and a capacitance $Ctn$ ($=Csn+Cln$) of the whole segment portion $Sn$, an emission rise time $t$ becomes $t=Ctn \cdot Vem/In=(Csn+Cln) \cdot Vem/J \cdot Ssn = (1+(Cln/Csn)) \cdot Vem/(J \cdot Ss/Cdn)=(1+(Cln/Csn)) \cdot Vem/(J \cdot Ss/Ssn \cdot Cs))= (1+(Cln/Csn)) \cdot Vem/(J/Cs)$.

When an emission luminance is determined, the light emission voltage $Vem$ and the current density J are constant irrespective of the area $Ssn$ of the segment portion $Sn$, and when the structure of the organic EL element is determined, the capacitance $Csn$ becomes constant in the element, and accordingly, $Vem/(J/Cs)$ is made a constant $\alpha$.

From the above, it is understood that the emission rise time $t$ is changed in accordance with the ratio of the capacitance $Csn$ of the segment portion $Sn$ to the capacitance $Cln$ of the wiring portion $Ln$, i.e., $Cln/Csn= (erl \cdot e0 \cdot (Sln/dl))/(erd \cdot e0 \cdot (Sdn/ds))=erl \cdot ds \cdot Sln/ers \cdot d1 \cdot Ssn$. That is, as the value of $Cln/Csn$ becomes large, the emission rise time $t$ becomes long, and as the value of $Cln/Csn$ becomes small, the emission rise time $t$ becomes short.

Here, since the relative dielectric constant $ers$, $erl$ and the distance $ds$, $dl$ are constant in the organic EL element, if $erl \cdot ds/ers \cdot dl$ is made a constant $\beta$, then $Cln/Cdn=\beta \cdot (Sln/Ssn)$, and the emission rise time $t$ becomes $\alpha \cdot (1+\beta \cdot (Sln/Ssn))$.

In the above relational expression, if $\beta \cdot (Sln/Ssn)$ of the latter part is a value sufficiently smaller than 1, a difference of the emission rise time $t$ hardly occurs. However, the relation as mentioned above is actually hard to produce, and a difference occurs in the emission rise time t, and the problem as described in the prior art occurs.

In order to solve such a problem, by making the ratio of the area Ssn of the segment portion Sn to the area Sln of the wiring portion Ln constant, the emission rise time t in the segment portion Sn can be made theoretically constant.

Incidentally, as described before, the difference of the emission rise time t causes the difference of the emission luminance, however, according to human optics, the difference is hard to visually recognize in the range where the emission luminance is higher (lower) than the minimum luminance (maximum luminance) by about 20 to 30%. Accordingly, as in this embodiment, in the case where there is no large difference among the areas Ss1 to Ss7 of the segment portions S1 to S7, the problem of the difference of the emission luminance due to the difference of the emission rise time t is greatly influenced by a large difference existing in the wiring portion Ln, and it becomes a problem between the segment portions S1, S2 and S6 (former) positioned above and the segment portions S3 to S5 and S7 (latter) positioned below.

As described before, as the value of Cln/Csn becomes large, the emission rise time t becomes long, and the value of Cln/Csn becomes small, the emission rise time t becomes short. In this embodiment, if the areas Ssn of the segment portions Sn are substantially equal to each other, the capacitances Csn become substantially equal to each other, and the capacitance C11, C12, C16 of the former becomes large as compared with the capacitance C13 to C15, C17 of the latter, and hereby, the emission rise time t1 of the former becomes longer than the emission rise time t2 of the latter.

Accordingly, in order to uniform the emission rise times tn in the segment portions Sn, it is conceivable that the emission rise time t2 is made to approach the emission rise time t1, or to the contrary, the emission rise time t1 is made to approach the emission rise time t2. That the emission rise time t1 is made to approach the emission rise time t2 is to shorten the emission rise time t1, and in order to realize this, Cln (Sln) is made small, and/or Csn (Ssn) is made large. That the area Sln is made small is to shorten the wiring portion Ln, and this receives restrictions by the arrangement of the segment portion Sn and is not easy. Besides, enlargement of the area Ssn can not be freely carried out since the shape of the segment portion Sn is determined in accordance with the design.

Accordingly, in order to uniform the emission rise time t, it is necessary to make the emission rise time t2 approach the emission rise time t1, that is, to prolong the emission rise time t2, and in order to realize this, Cln (Sln) is made large and/or Csn (Ssn) is made small. However, as described before, enlargement of the area Ssn can not be freely carried out since the shape of the segment portion Sn is determined in accordance with the design.

Then, the enlargement of the area Sln is the only way left, and in this embodiment, the areas S13 to S15 and S17 of the latter wiring portions L3 to L5 and L7 are enlarged.

In order to enlarge the areas S13 to S15 and S17, a suitable method can be adopted, for example, their lengths are made longer, or their widths are made wider.

Figure 2:
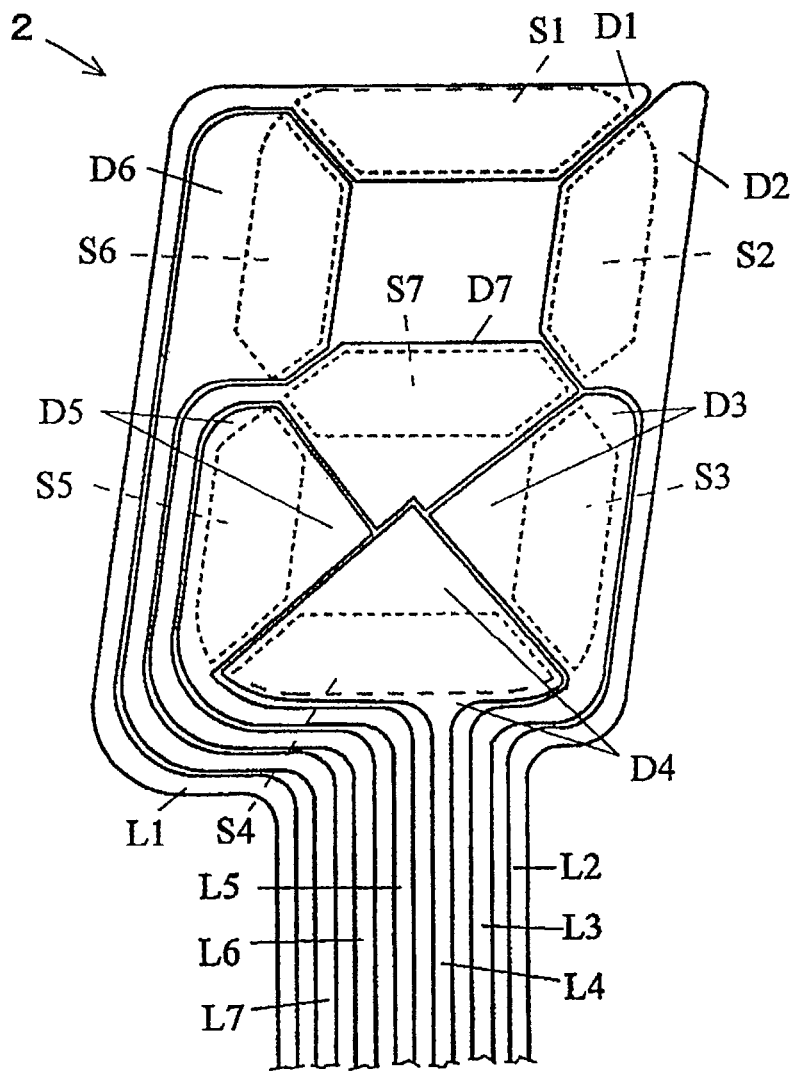
FIG. 2 is a plan view for explaining a transparent electrode of the same as the above.
Figure 3:
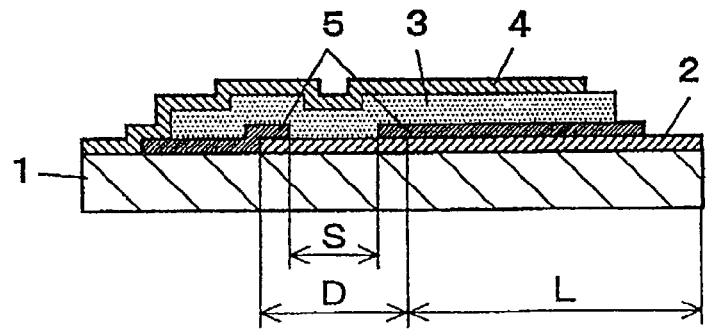
FIG. 3 is a main part sectional view for explaining a structure of an organic EL element.
Figure 4:
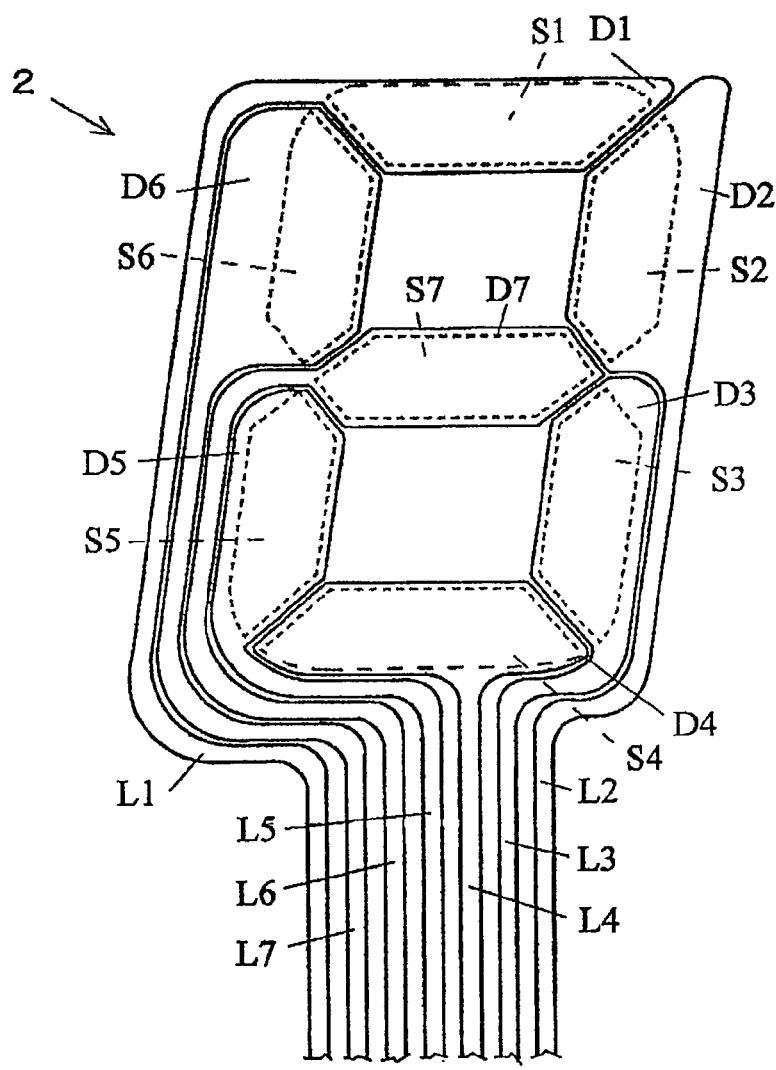
FIG. 4 is a plan view for explaining a transparent electrode of the same as the above.

In FIG. 2, as an example, the shapes of the display portions D3 to D5 and D7 are made such that they are extended to a place which is the inside of the display of the segment portions S1 to S7 and is covered with the insulating layer, that is, they are extend into the inner region surrounded by the segment portions S3 to S5 and S7, in which the segment portions Si to S7 and the wiring portions L1 to L7 are not provided, and the areas of the display portions D3 to D5 and D7 are increased, so that the areas S13 to S15 and S17 are enlarged. That is, although the display portions D3 to D5 and D7 include the segment portions S3 to S5 and S7, that the areas of the display portions D3 to D5 and D7 are enlarged without changing the shapes of the segment portions S3 to S5 and S7 is substantially to increase the areas S13 to S15 and S17 of the wiring portions L3 to L5 and L7 since the portions function as part of the wiring portions L3 to L5 and L7.

As stated above, the area Sln of the wiring portion Ln of the segment portion Sn having a small emission rise time t (high emission luminance) is enlarged such that the emission luminance falls within the range of from a minimum luminance to a luminance higher than the minimum luminance by 30% (preferably, 20%), and as a result, the difference of the emission luminance in the whole organic EL element can be made to fall within a range to such a degree that it can not be visually recognized, and the display quality can be improved.

INDUSTRIAL APPLICABILITY

As described above, the present invention can provide an organic EL element which improves a difference of emission luminance due to a difference of emission rise time in a plurality of light emitting portions, and can improve the display quality of the organic EL element.

What is claimed is:

1. An organic EL element comprising:
   an organic layer disposed between a transparent electrode and a back electrode;
   a plurality of segment portions as emission sites; and
   a plurality of wiring portions connected to a constant current source and for separately supplying electric currents to respective segment portions,
   wherein in order that an emission rise time of each of the segment portions is made constant, a ratio of electrostatic capacitance of the segment portion and that of the wiring portion is made constant in each of the segment portions.

2. An organic EL element comprising:
   an organic layer disposed between a transparent electrode and a back electrode;
   a plurality of segment portions as emission sites; and
   a plurality of wiring portions connected to a constant current source and for separately supplying electric currents to the respective segment portions,
   wherein the segment portions are arranged in a shape of a numeral 8 and in order that an emission rise time of each of the segment portions is made constant, a wiring portion of a segment portion high in emission brightness is extended inside of a display of the numeral 8 to make an area of the wiring portion larger, and thereby a ratio of electrostatic capacitance of the segment portion and that of the wiring portion is made constant in each of the segment portions.

3. An organic EL element comprising:
   an organic layer disposed between a transparent electrode and a back electrode;
   a plurality of segment portions as emission sites; and
   a plurality of wiring portions connected to a constant current source and for separately supplying electric currents to the respective segment portions,
   wherein in order that an emission rise time of each of the segment portions is made constant a ratio of an area of the segment portion and that of the wiring portion is made constant in each of the segment portions.

4. An organic EL element comprising:

an organic layer disposed between a transparent electrode and a back electrode;

a plurality of segment portions as emission sites; and a plurality of wiring portions connected to a constant current source and for separately supplying electric currents to the respective segment portions, wherein the segment portions are arranged in a shape of a numeral 8 and in order that an emission rise time of each of the segment portions is made constant, a wiring portion of a segment portion high in emission brightness is extended inside of a display of the number 8 to make an area of the wiring portion larger, and thereby a ratio of an area of the segment portion and that of the wiring portion is made constant in each of the segment portions.

* * * * *